United States Patent
Richardson et al.

(10) Patent No.: US 6,417,058 B1
(45) Date of Patent: Jul. 9, 2002

(54) SIGE/POLY FOR LOW RESISTANCE EXTRINSIC BASE NPN TRANSISTOR

(75) Inventors: William F. Richardson; Yuji Sasaki, both of San Antonio, TX (US)

(73) Assignees: Sony Corporation, Tokyo (JP); Sony Electronics Inc., San Diego, CA (US)

(*) Notice: Subject to any disclaimer, the term of this patent is extended or adjusted under 35 U.S.C. 154(b) by 0 days.

(21) Appl. No.: 09/593,345

(22) Filed: Jun. 14, 2000

(51) Int. Cl.⁷ .............................................. H01L 21/331
(52) U.S. Cl. ........................................ 438/312; 257/197
(58) Field of Search .................................. 438/309, 312, 438/314, 357, 360, 361, 363, 202, 222, 226, 233, 234, 235; 257/197, 198, 200

(56) References Cited

U.S. PATENT DOCUMENTS

| | | | | |
|---|---|---|---|---|
| 5,506,427 A | * | 4/1996 | Imai | 257/197 |
| 5,585,302 A | | 12/1996 | Li | 437/60 |
| 6,043,552 A | * | 3/2000 | Miwa | 257/587 |
| 6,043,554 A | | 3/2000 | Miwa | 257/588 |
| 6,346,453 B1 | * | 2/2002 | Kovacic et al. | 438/312 |

OTHER PUBLICATIONS

Harame et al., Si/SiGe Epitaxial–Base Transistors—Part II: Process Integration and Analog Applications, IEEE Transactions on Electron Devices, vol. 42, No. 3, pp 469–482 Mar. 1995.

Bensahel et al., single Wafer Processing of in–situ Doped Polycrystalline Si and $Si_{1-x}Ge_x$, Pre–edited paper submitted to Solid State Technology Mar. 1998.

Chantre et al., A High Performance Low Complexity SiGe HBT for BiCMOS Integration, IEEE BCTM 5.2 pp 93–96 1998.

* cited by examiner

Primary Examiner—David Nelms
Assistant Examiner—Quoc Hoang
(74) Attorney, Agent, or Firm—Wood, Herron & Evans, LLP

(57) ABSTRACT

A low resistance bipolar transistor extrinsic base and method of manufacture. A layer of heavily doped polysilicon is deposited over an oxide layer on an npn silicon substrate and a window is formed through to an n doped region of the substrate. Epitaxial SiGe is grown on the polysilicon layer and within the window. Dopant from the polysilicon layer diffuses into the SiGe layer thereby lowering its resistance.

24 Claims, 3 Drawing Sheets

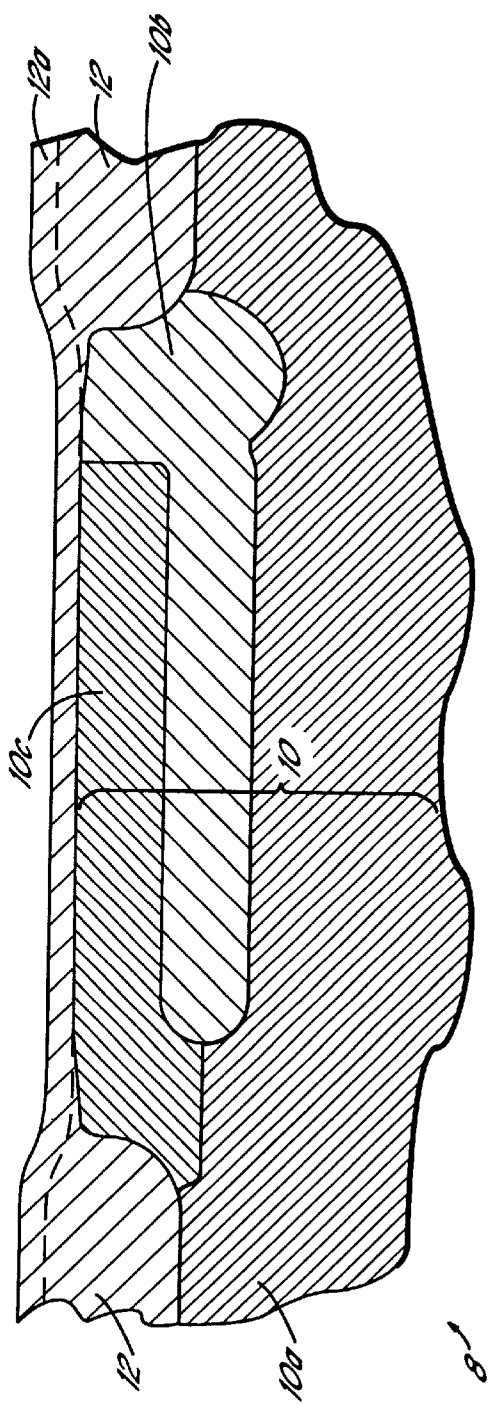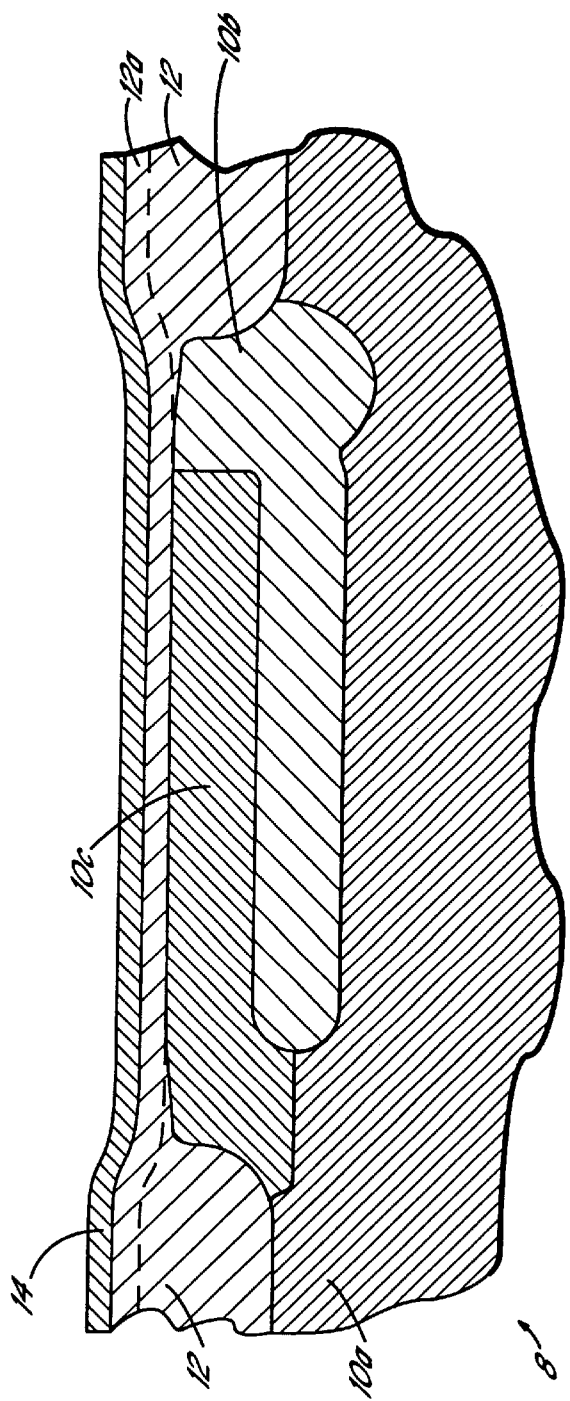

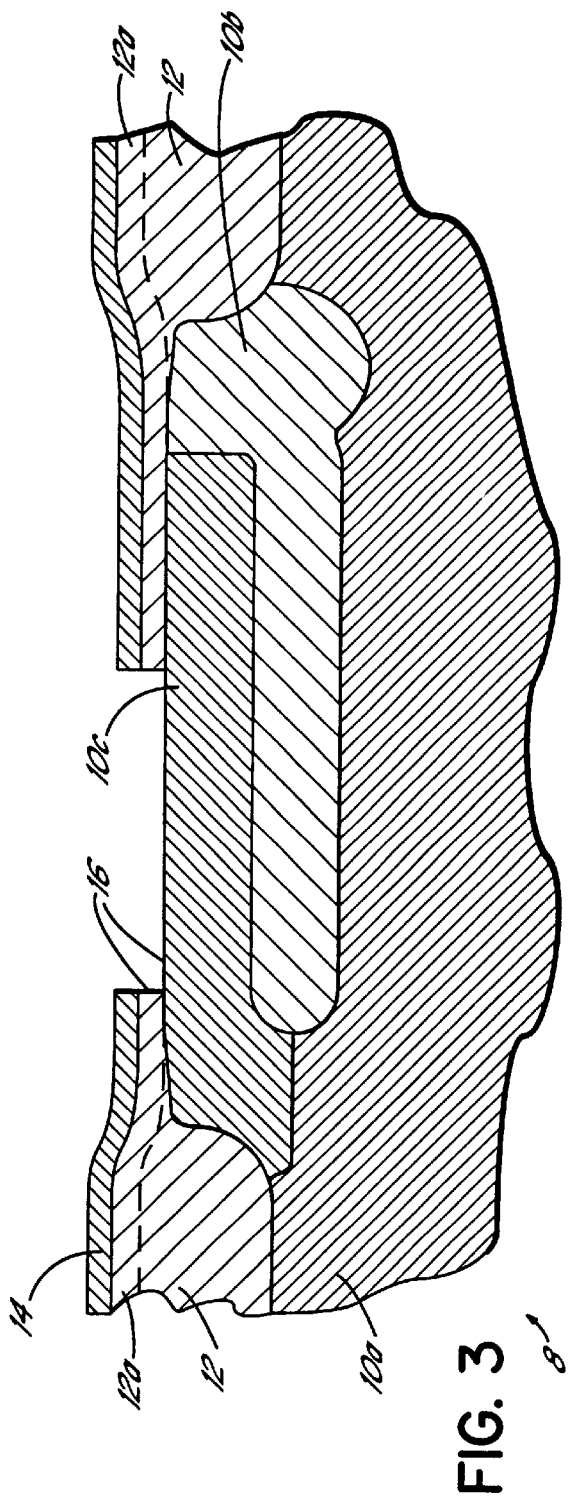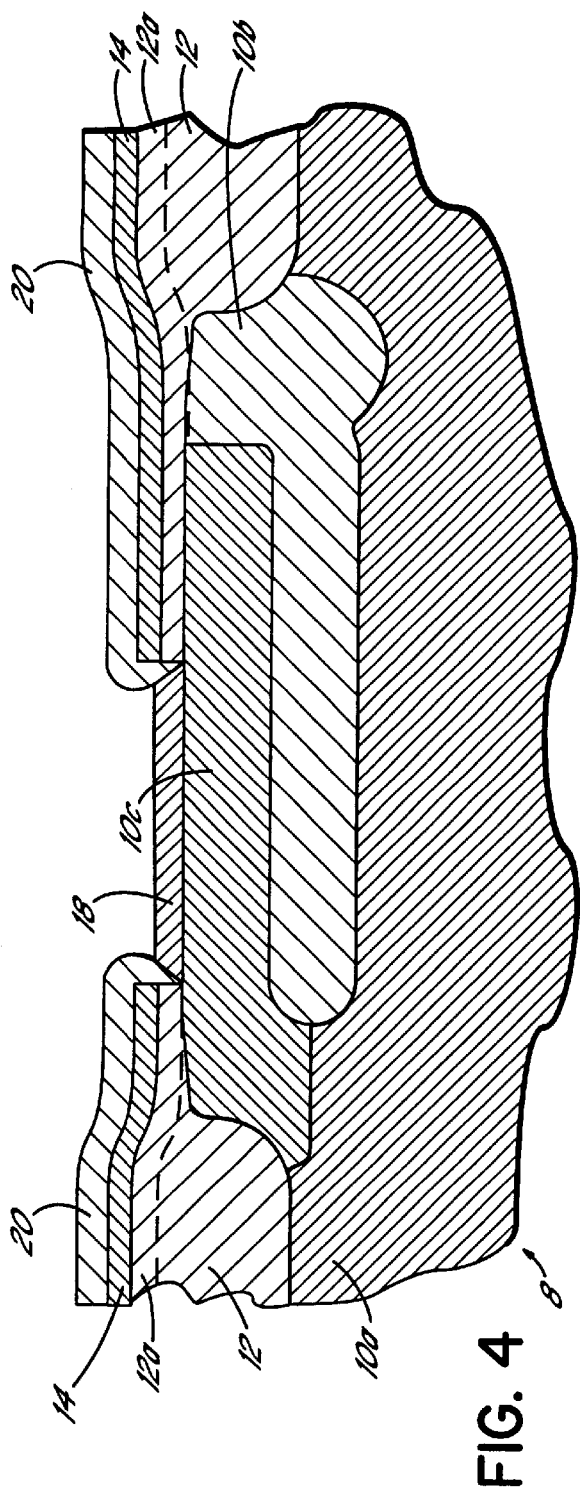
FIG. 3
FIG. 4

SIGE/POLY FOR LOW RESISTANCE EXTRINSIC BASE NPN TRANSISTOR

FIELD OF THE INVENTION

This invention relates to a bipolar transistor and its manufacturing method.

BACKGROUND OF THE INVENTION

The demand for enhanced bipolar transistors has increased as a result of the demand for larger-sized and higher performance integrated circuits. SiGe bipolar transistors, with SiGe epitaxial bases, are known to provide such enhancements. For a high performance bipolar transistor, it is necessary to minimize the resistance and capacitance in the connection from the device base to the metal contact. The normal process opens a hole in an oxide layer exposing the single crystal substrate where the base and eventually the emitter will be formed. Because an epitaxial intrinsic base must be used in the SiGe transistor, the common practice of forming the extrinsic base in low capacitance, oxide isolated polysilicon before doping the intrinsic base cannot be employed and other techniques have been developed. The extrinsic base has been made, for example, under the oxide through a junction isolated diffusion in the substrate (high parasitic junction capacitance) in conjunction with selective SiGe base epitaxy, although this technique has not been successfully implemented in a production process. Alternatively, an oxide isolated polysilicon layer may be deposited after the SiGe base, but additional processing is detrimental to transistor performance. Extrinsic bases have also been made by simply using the poly-SiGe layer deposited on the oxide during the growth of the epitaxial base within the window. The epitaxial layer must be thin to achieve the high performance transistor but the concurrently deposited poly-SiGe layer is even thinner due to the delay in initiating the growth of SiGe on oxide. The thinner layer over the oxide has a high resistance unsuitable for high performance devices. There is thus a need for an oxide isolated, low resistance extrinsic base to achieve the high performance SiGe bipolar transistors and a manufacturing method that is adaptable to the production environment.

SUMMARY OF THE INVENTION

A method is provided for producing high performance bipolar transistor devices. To this end, and in accordance with the principles of the present invention, a layer of highly doped polysilicon is formed on an oxide layer on a silicon substrate, and a device window is formed by removing a portion of the highly doped polysilicon layer and the oxide layer to expose an n doped region of the silicon substrate. Epitaxial deposition then occurs both within the window to form a layer of p doped epi-SiGe on the substrate within the window and outside the window to form a layer of p doped poly-SiGe over the highly doped polysilicon layer. In the process of the present invention, the p dopant is already in place in the polysilicon layer prior to epitaxial deposition. Thus, less thermal processing is required, as the dopant does not need to be implanted and activated after epitaxial deposition. Moreover, the method of the present invention provides a uniform deposition of SiGe both above the oxide layer and within the device window.

These and other objects and advantages of the present invention shall become more apparent from the accompanying drawings and description thereof

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

FIGS. 1–6 illustrate in cross-sectional view manufacturing processes according to the method of the present invention for making a bipolar transistor device as shown in FIG. 6.

DETAILED DESCRIPTION

Figure 5:
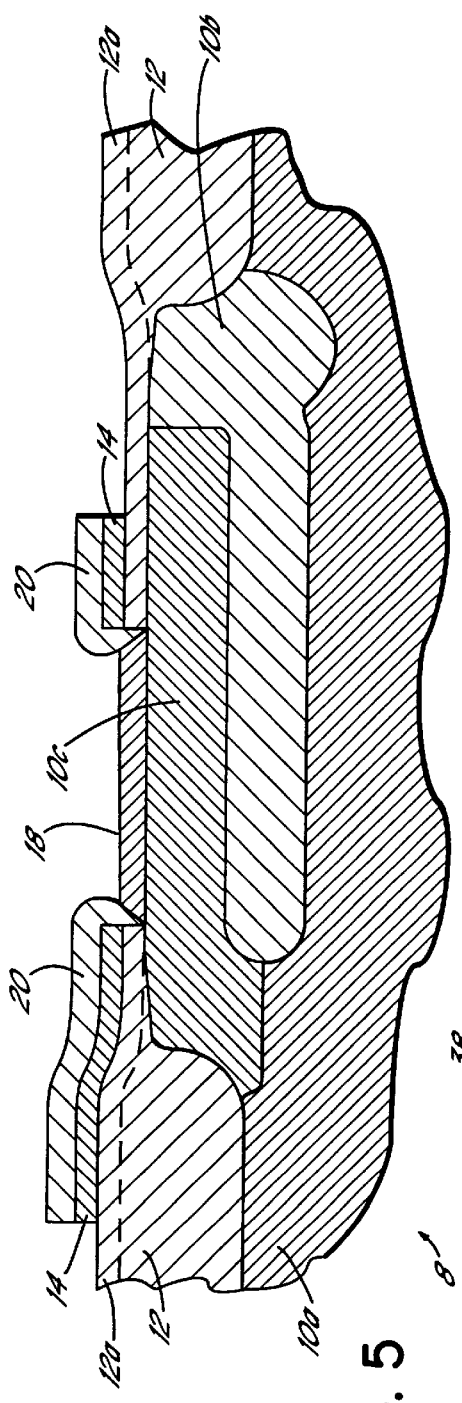

The present invention will be described with reference to FIGS. 1–6, in sequence. Normal buried collector and isolation processing is employed in the transistor device 8 of the present invention, such as shown in FIG. 1. A silicon substrate 10 is provided having a p doped region 10a, an n+ doped region 10b and an n doped region 10c located between thick oxide regions 12, commonly known as field oxide. The field oxide is typically grown in a diffusion furnace by oxygen flow in a high temperature environment, as is well known in the art. Throughout the present description, it is to be understood that n doping refers to light doping with a group VA element, including N, P, As, Sb, and Bi; and that n+ doping refers to heavy doping with an n-type dopant. It is further understood that p doping refers to light doping with a Group IIIA element, including B, Al, Ga, In, and Tl; and that p+ doping refers to heavy doping with a p-type dopant. It is further understood, as is known in the art, that the higher the net doping content, the lower the resistance of the silicon material. The p doped region 10a of substrate 10 forms the lower part of the substrate. The n+ doped region 10b is commonly referred to as the buried collector region, and a portion of this n+ doped region 10b extends to the top of substrate 10 to ultimately form the collector contact of the transistor device 8. The n doped region 10c also forms a portion of the upper surface of substrate 10 and further covers a portion of the n+ doped region 10b. An oxide layer 12a is formed on the entire surface of substrate 10 and field oxide 12, typically using chemical vapor deposition (CVD) technology. Oxide layer 12a is also commonly referred to as an isolation layer. Oxide layer 12a should be thick enough to isolate between devices, and is typically at least 2000 Å thick. For a 0.3 μm emitter opening device, the oxide layer 12a may be, for example, on the order of 8000 Å. Substrate 10 with field oxide 12 and oxide layer 12a as described above and as depicted in FIG. 1 is commonly known for bipolar processing.

A key aspect of the present invention is depicted in FIG. 2. A layer of p+ doped polysilicon 14 is deposited onto the surface of the oxide layer 12a on substrate 10. The p+ doped polysilicon layer 14 may be applied by standard low pressure CVD, typically conducted around 800° C. The thickness of p+ doped polysilicon layer 14 depends on the size of the device 8, and by way of example, may be on the order of 1500 Å for a device having 0.3 μm emitter opening.

Depicted in FIG. 3 is the formation of a device window 16 which is patterned and etched to expose the n doped region 10c of substrate 10 where device 8 will be made. To this end, a portion of p+ doped polysilicon layer 14 and oxide layer 12a is removed by lithographic technology and by etching technology to form an opening or window 16. The lithographic technique commonly uses a photoresist mask (not shown), which is removed after the etching is performed. The etching technique is typically an ion etching or reactive ion etching using a plasma. The removal of layers 12 and 14 typically require different chemistries, so etching is a two-step process for the sequential removal of each layer, and these two processes may be performed in the same or in different machines.

Following formation of the device window 16, epitaxial deposition is performed, with the resulting structure depicted in FIG. 4. An epitaxial layer of p doped epi-SiGe 18 is formed on the n doped region 10c of substrate 10, and an epitaxial layer of p doped poly-SiGe 20 is formed over the p+ doped polysilicon layer 14. It is to be understood that epitaxial deposition refers to the oriented growth of one crystalline substance upon the surface of another crystalline substance. Within device window 16, the epi-SiGe layer 18 is a single crystal grown in the same crystal orientation of the single crystal substrate upon which it is deposited. The poly-SiGe layer 20 refers to a polycrystalline structure of SiGe grown on the heavily p doped polysilicon layer 14. The p doped poly-SiGe layer 20 immediately begins to deposit outside the window 16 by virtue of it being epitaxial deposition, resulting in a uniformly thick layer of p doped poly- and epi-SiGe across the surfaces of the heavily doped polysilicon layer 14 and within the device window 16. Again, the thickness of the epitaxial layers 18 and 20 are dependent upon the size of the device. By way of example only, the thickness may be on the order of 1200–4000 Å, and may be about 1800 Å for a 0.3 µm emitter opening device. Without the p+ doped polysilicon layer 14, poly-SiGe growth would have to occur on the oxide layer 12a, and would consequently begin more slowly than the growth within the device window 16, thus resulting in a thinner layer of poly-SiGe 20 over the oxide 12a than the epi-SiGe layer 18 in the device window 16. The thicker the composite of polysilicon layer 14 and poly-SiGe layer 20, the lower its resistance, which low resistance is essential for high performance bipolar transistors.

During epitaxial growth, and during subsequent thermal processing such as silicide formation, dopant activation and/or additional device formation, the p dopant in the p+ polysilicon layer 14 and the p doped poly-SiGe layer 20 homogenizes or becomes uniform throughout both layers. In other words, the p+ doped polysilicon layer 14 acts as an additional dopant source for the p doped poly-SiGe layer 20, with some p dopant diffusing from the p+ doped polysilicon layer 14 into the p doped poly-SiGe layer 20, thereby lowering the resistance of the poly-SiGe layer 20. This eliminates the need for implanting p dopant into the poly-SiGe layer 20 to lower its resistance. Although there may be an interface between the polysilicon layer 14 and poly-SiGe layer 20, for electrical purposes the two layers form a single layer with a uniform amount of p dopant in a concentration significantly greater than normal p doping but less than normal p+ doping. By way of example and not limitation, normal p doping may be on the order of $10^{17}$ atoms/cm$^3$ and normal p+ doping may be on the order of $10^{19}$–$10^{20}$ atoms/cm$^3$. Upon diffusion of p+ dopant from layer 14 into layer 20, both layer 14 and 20 may have a dopant concentration on the order of $10^{18}$–$10^{19}$ atoms/cm$^3$.

Following the epitaxial SiGe deposition, the device 8 is again patterned and etched, as shown in FIG. 5 to remove a portion of the polysilicon layer 14 and poly-SiGe layer 20 from an outer portion of the device 8. This step is well known in the art, and per se, forms no part of the present invention.

Figure 6:
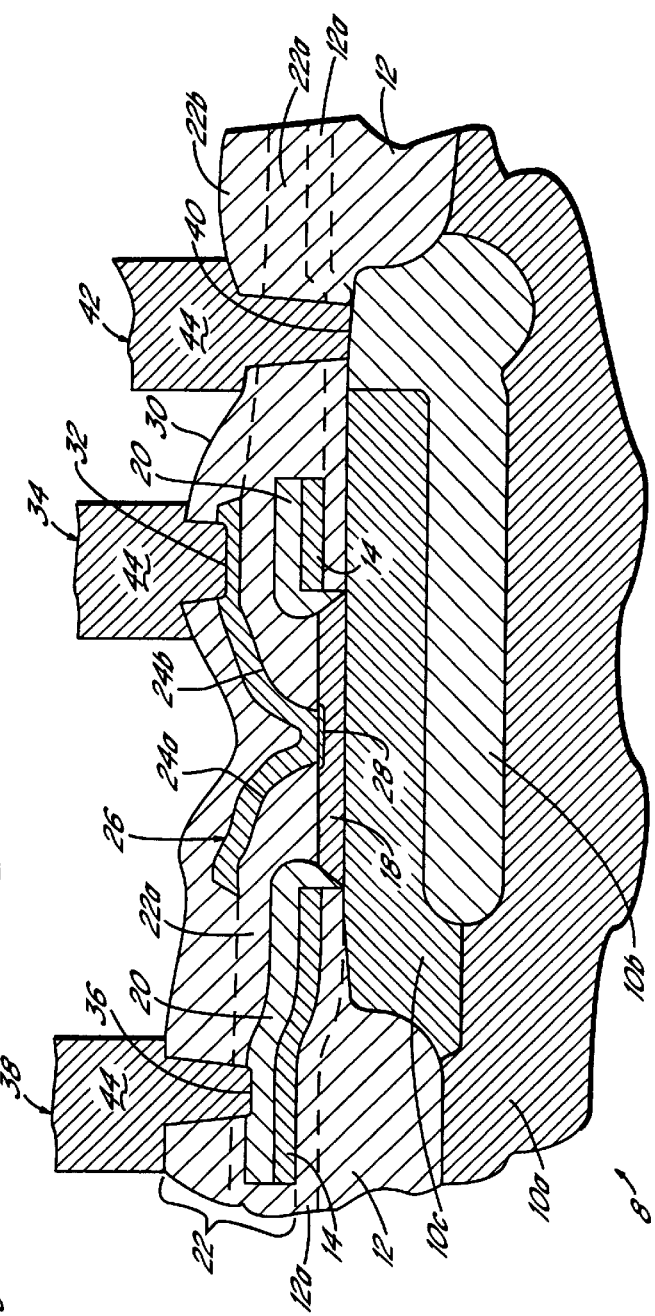

The device 8 is then completed as depicted in FIG. 6. One or more dielectric layers 22a of either silicon oxide or silicon nitride are deposited, such as by CVD, over p doped poly-SiGe layer 20 and p doped epi-SiGe layer 18, and patterned to remove a portion of the dielectric from a region above the epi-SiGe layer 18, leaving side walls 24a,24b.

Dielectric layer 22a may, for example, be on the order of 200–1500 Å, and may be about 1000 Å for a 0.3 µm emitter opening device. An n+ doped polysilicon emitter connector 26 is then formed, such as by low pressure CVD, within the dielectric layer 22a on the exposed surface of the p doped epi-SiGe layer 18. Again, the thickness of the emitter connector 26 is dependent upon the size of the device, but may be on the order of 1000–3000 Å for example, and may be on the order of about 1450 Å for a 0.3 µm emitter opening device. Some of the n+ dopant diffuses out of the polysilicon slightly into epi-SiGe layer 18 to form the emitter as depicted by reference numeral 28. Emitter 28 may have a thickness up to 1000 Å, for example, and may have a typical depth of diffusion of about 500 Å for a 0.3 µm emitter opening device. Further dielectric material 22b is then deposited over the previous dielectric layer 22a and over the emitter connector 26 to form a top surface 30 comprising the dielectric layer 22. The additional dielectric layer 22b may be on the order of 1000–4000 Å thick, by way of example only, and may be about 2900 Å for a 0.3 µm emitter opening device. A contact hole 32 is then formed either over the emitter 28 or adjacent to it through the dielectric layer 22b to the emitter connector 26 for forming the emitter connection 34 of the transistor device 8. Another contact hole 36 is formed through the dielectric layer 22 to the p doped poly-SiGe layer 20 for forming the base connection 38 of the transistor device 8. A third contact hole 40 is formed through the dielectric layer 22 and oxide layer 12a to the n+ doped region 10b of the substrate 10 for forming the collector connection 42 of the transistor device 8. The contact holes 32,36,40 may be formed by any suitable process, such as reactive ion etching. The contact holes 32,36,40 are then coated or filled with a contact metal 44 to form the emitter connection 34, base connection 38 and collector connection 42, respectively. The contact metal 44 is preferably either tungsten, aluminum or a combination thereof While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method for epitaxial deposition of SiGe for bipolar transistor devices, comprising the steps of:

forming a p+ doped polysilicon layer on an oxide layer on a silicon substrate;

removing a portion of the p+ doped polysilicon layer and a portion of the oxide layer to expose at least a portion of an upper surface of the silicon substrate; and depositing an epitaxial layer of p doped epi-SiGe on the exposed upper surface of the silicon substrate and simultaneously depositing an epitaxial layer of p doped poly-SiGe over the p+ doped polysilicon layer.

2. The method of claim 1, wherein the substrate includes a buried collector and isolation structure comprising a p doped region, an n doped region, and an n+ doped region, with the n doped region comprising at least a portion of an upper surface of the substrate.

3. The method of claim 1, wherein the thickness of the p doped epi-SiGe layer is approximately equal to the thickness of the p doped poly-SiGe layer.

4. The method of claim 1 further comprising thermal processing wherein the dopant concentration of the p+ doped polysilicon layer and the p doped poly-SiGe layer becomes uniform throughout the layers.

5. The method of claim 1 further comprising forming a first dielectric layer over the p doped poly-SiGe and p doped epi-SiGe layers.

6. The method of claim 5, wherein the dielectric material is selected from the group consisting of: silicon oxide, silicon nitride and combinations thereof.

7. The method of claim 5 further comprising forming an emitter connector of n+ doped polysilicon within the dielectric layer on a surface of the p doped epi-SiGe layer, wherein n+ dopant diffuses into the surface of the p doped epi-SiGe layer to form an emitter.

8. The method of claim 7 further comprising forming a second dielectric layer over the first dielectric layer and over the emitter connector.

9. The method of claim 8 further comprising forming a contact hole through the second dielectric layer to the emitter connector and coating the contact hole with a contact metal to electrically contact the emitter of the transistor.

10. The method of claim 9, wherein the contact metal is selected from the group consisting of tungsten, aluminum and combinations thereof.

11. The method of claim 8 further comprising forming a contact hole through the first and second dielectric layers to the p doped poly-SiGe layer and coating the contact hole with a contact metal to form a base connection of the transistor.

12. The method of claim 11, wherein the contact metal is selected from the group consisting of tungsten, aluminum and combinations thereof.

13. The method of claim 8 further comprising forming a contact hole through the first and second dielectric layers and through the oxide layer to an n+ doped region of the substrate and coating the contact hole with a contact metal to form a collector connection of the transistor.

14. The method of claim 13, wherein the contact metal is selected from the group consisting of tungsten, aluminum and combinations thereof.

15. The method of claim 1, wherein the step of removing includes a first plasma etching to remove the portion of the p+ doped polysilicon layer and a second plasma etching to remove the portion of the oxide layer.

16. The method of claim 1, wherein the p+ doped polysilicon layer is deposited by low pressure CVD.

17. A method for forming a bipolar transistor device, comprising the steps of:

providing a structure comprising a silicon substrate having a p doped region, an n doped region, and an n+ doped region, with the n doped region comprising at least a portion of an upper surface of the substrate, and an oxide layer over the upper surface of the substrate;

forming on the oxide layer a p+ doped polysilicon layer;

removing a portion of the p+ doped polysilicon layer and the oxide layer to expose at least a portion of the n doped region;

depositing an epitaxial layer of p doped epi-SiGe on the exposed n doped region and simultaneously forming an epitaxial layer of p doped poly-SiGe over the p+ doped polysilicon layer;

forming a first dielectric layer over the p doped poly-SiGe layer and over the p doped epi-SiGe layer leaving a portion of the p doped epi-SiGe layer exposed;

forming a layer of n+ doped polysilicon on the exposed p doped epi-SiGe layer;

forming a second dielectric layer over the first dielectric layer and over the n+ doped polysilicon layer to form an upper surface of dielectric material;

forming a first contact hole through the first and second dielectric layers to the p doped poly-SiGe layer, a second contact hole through the second dielectric layer to the n+ doped polysilicon layer, and a third contact hole through the first and second dielectric layers and through the oxide layer to the n+ doped region of the substrate.

18. The method of claim 17, wherein the thickness of the p doped epi-SiGe layer is approximately equal to the thickness of the p doped poly-SiGe layer.

19. The method of claim 17, wherein the dopant concentration of the p+ doped polysilicon layer and the p doped poly-SiGe layer becomes uniform throughout the layers subsequent to depositing the p doped poly-SiGe.

20. The method of claim 17, wherein the dielectric material is selected from the group consisting of: silicon oxide, silicon nitride and combinations thereof.

21. The method of claim 17 further comprising coating the contact holes with a contact metal to form an emitter connection, base connection and collector connection of the transistor.

22. The method of claim 21, wherein the contact metal is selected from the group consisting of tungsten, aluminum and combinations thereof.

23. The method of claim 17, wherein the step of removing includes a first plasma etching to remove the portion of the p+ doped polysilicon layer and a second plasma etching to remove the portion of the oxide layer.

24. The method of claim 17, wherein the dielectric material is selected from the group consisting of: silicon oxide, silicon nitride and combinations thereof.

* * * * *